(12) United States Patent
Thon

(10) Patent No.: US 7,103,329 B1
(45) Date of Patent: Sep. 5, 2006

(54) ADAPTIVE FEEDBACK CHANNEL FOR RADIO FREQUENCY POWER AMPLIFIERS

(75) Inventor: Robert J. Thon, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1170 days.

(21) Appl. No.: 10/056,967

(22) Filed: Oct. 25, 2001

(51) Int. Cl.
*H01Q 11/12* (2006.01)

(52) U.S. Cl. .................. 455/126; 455/127.1; 455/106; 330/151

(58) Field of Classification Search ................ 455/126, 455/296, 69, 127.2, 108; 330/151, 149, 107; 332/162; 327/306, 316, 332

See application file for complete search history.

(56) References Cited

U.S. PATENT DOCUMENTS 5,237,288 A * 8/1993 Cleveland .................. 330/107

* cited by examiner

*Primary Examiner*—Melur Ramakrishnaiah
(74) *Attorney, Agent, or Firm*—Nathan O. Jensen; Kyle Eppele

(57) ABSTRACT

A radio frequency (RF) amplifier system includes an RF power amplifier having an input and an output, and a typical gain of 1000 or more between the input and the output. An adaptive feedback channel is coupled between the input and the output of the RF power amplifier. The adaptive feedback channel receives as inputs audio signals for modulation of the input of the RF power amplifier, a frequency command word indicative of a desired frequency and phase of the RF amplifier system, and a control word indicative of a desired power level of the output of the RF power amplifier and of a mode of operation of the RF amplifier system. In response to the inputs, the adaptive feedback channel provides as an output a degenerative feedback signal to the input of the RF power amplifier.

13 Claims, 2 Drawing Sheets

ADAPTIVE FEEDBACK CHANNEL FOR RADIO FREQUENCY POWER AMPLIFIERS

FIELD OF THE INVENTION

The present invention relates to radio frequency power amplifiers. More particularly, the present invention relates to feedback for radio frequency power amplifiers which enhances the dynamic output level control, efficiency and linearity of the radio frequency power amplifier.

BACKGROUND OF THE INVENTION

Contemporary radio frequency (RF) power amplifiers lack the dynamic output level control, efficiency, and linearity to meet present and future RF system requirements. Present technology RF power amplifiers utilize an analog Automatic Level Control (ALC) to control RF power output levels. These current designs have limited dynamic control range and less than desired output level stability in applications such as amplitude modulation (AM), frequency modulation (FM), spread spectrum, and special modulation waveform signals. One prior art RF power amplifier control methodology is to shift the active element's bias or operational "Q" point, which changes the gain of one or more amplifier stages, thus controlling the RF output of the power amplifier. Shifting the "Q" point degrades amplifier efficiency and linearity. This degradation is not acceptable in many systems.

Operational amplifiers are well known and were originally used to perform mathematical functions such as addition, sign changing, integration and differentiation in analog computers. Today they are used in many applications. The fundamental theories developed for analog computer modeling required the basic amplifiers to have gains of 60 dB to 140 dB. Once an amplifier met this criterion, simple mathematical formulas were used to describe operational conditions and feedback loops. This includes applications with complex impedance elements that provided integration and differentiation functions, as well as multi-pole filters. The basic theory of operational amplifiers and their applications are well understood because of their use in analog computers.

An operational amplifier contains many individual circuits within the physical package. This combination of circuits is analyzed as a composite element for operational amplifier applications. Operational amplifier circuit or application designs focus on the external feedback loops from input to output and disregard the internal circuits of the packaged amplifier. Applying the same operational amplifier feedback theory to RF power amplifiers has not been practical because the basic operational amplifier criterion of high gain is rarely met in RF amplifiers and because of the presence of parasitic impedance parameters in the feedback loop, which restrict the operational bandwidth of the amplifier. Most contemporary RF amplifiers operate over a wide RF spectrum which generally causes parasitic complex impedances throughout the amplifier circuits. The parasitic parameters may cause undesired performance over the frequency range of the RF amplifier. Some contemporary RF amplifiers utilize degenerative or negative feedback to stabilize individual RF amplifier circuits within the amplifier, but rarely interact between stages. For these or other reasons, most prior art RF amplifier designs do not provide the dynamic output level control, efficiency and linearity over a wide frequency ranges as required in new high performance applications.

SUMMARY OF THE INVENTION

A radio frequency (RF) amplifier system includes an RF power amplifier having an input and an output, and a typical gain of about 1000 between the input and the output. Amplifier stability is improved with higher system gain. An adaptive feedback channel is coupled between the input and the output of the RF power amplifier. The adaptive feedback channel receives as inputs audio signals for AM modulation of the input of the RF power amplifier, a frequency command word indicative of a desired frequency and phase of the RF amplifier system, and a control word indicative of a desired power level of the output of the RF power amplifier and of a mode of operation of the RF amplifier system (AM, FM, Spread spectrum & etc). In response to the inputs, the adaptive feedback channel provides as an output a degenerative feedback signal to the input of the RF power amplifier. This degenerative signal, acting with the high system gain of the amplifier, amplifies the RF input signal to the desired RF output parameters.

DETAILED DESCRIPTION OF AN ILLUSTRATIVE EMBODIMENT

Figure 1:
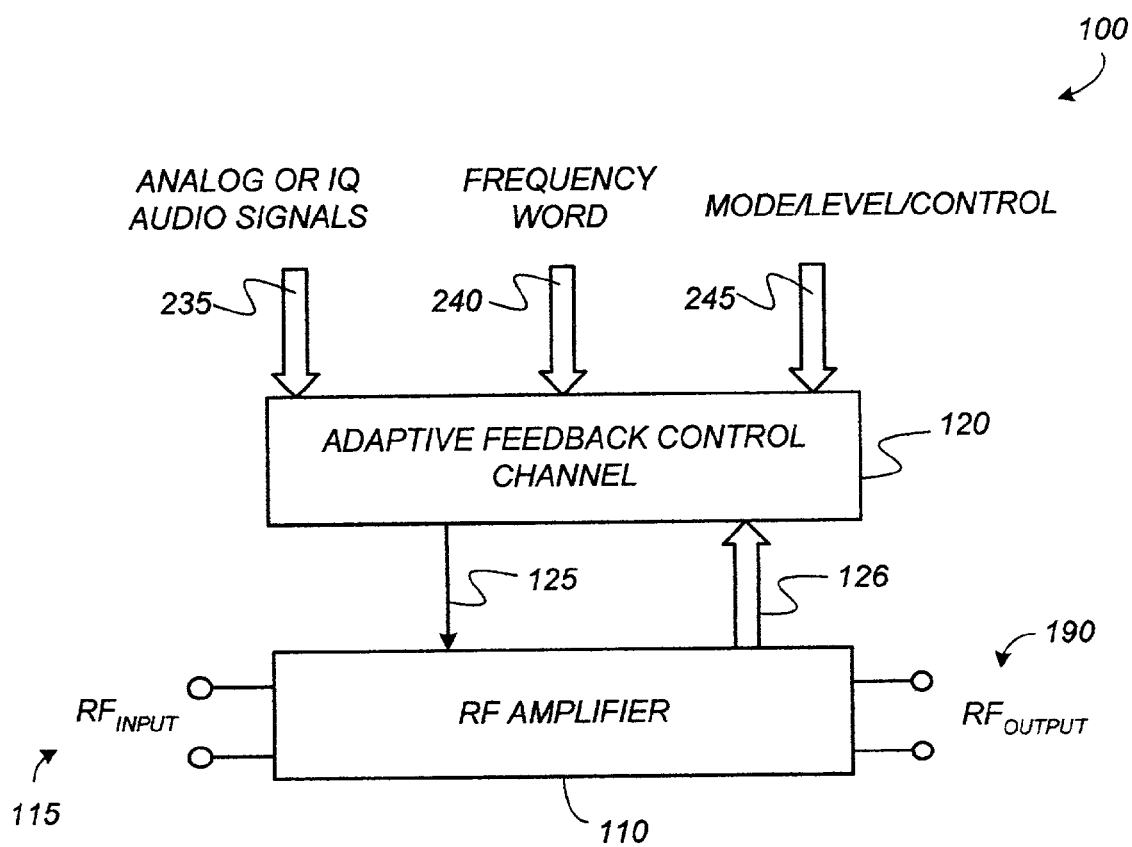
FIG. 1 is a high level block diagram illustrating an RF power amplifier in accordance with the present invention.

FIG. 1 is a block diagram which illustrates a feedback controlled RF power amplifier 100 in accordance with the present invention. RF power amplifier 100 includes an amplifier circuit 110 and an adaptive feedback control channel 120. Amplifier circuit 110 is an RF amplifier circuit having high gain, for example having a typical gain of 1,000 or greater, for amplification of an RF input signal $RF_{input}$ 115. While gains as low as 30 can be used with the adaptive feedback control channel of the invention, higher gains of at least between 100 and 1000 will provide improved stability and performance. Generally, however, the adaptive feedback control channel concepts disclosed herein are gain independent.

Figure 2:
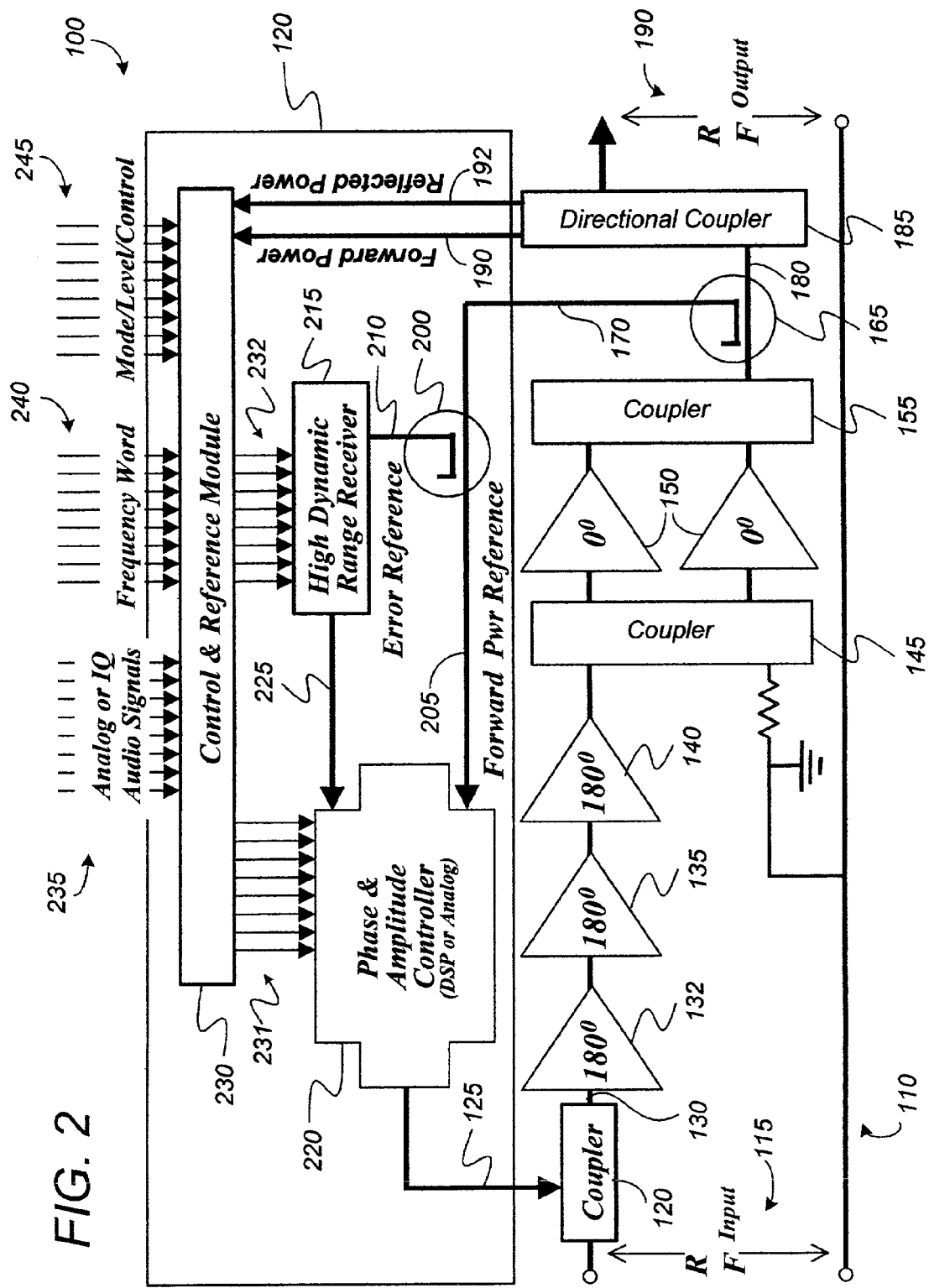
FIG. 2 is a detailed block diagram diagrammatically illustrating the RF power amplifier of FIG. 1 and showing in greater detail the adaptive feedback controller in accordance with a more particular embodiment of the present invention.

Using adaptive feedback control channel 120, dynamic output level control, efficiency and linearity of amplifier circuit 110 are enhanced. FIG. 2 is a block diagram illustrating a more particular embodiment of RF power amplifier 100. FIGS. 1 and 2 are discussed together to better illustrate the concepts of the invention. Adaptive feedback channel 120 of RF power amplifier 100 provides real time control of amplifier circuit 110 in any of a wide range of operational modes, some of which are discussed below in greater detail.

The present invention employs an adaptive feedback control solution to enhance traditional degenerative or negative feedback utilized in some audio, video, or RF amplifiers. The enhanced RF power amplifier control is provided by the use of adaptive amplitude and phase control channel 120. The adaptive amplitude and control channel includes a high dynamic range receiver 215, a phase and amplitude control module 220 and a control reference module 230, as well as other components and/or inputs as shown in FIG. 2.

Traditional feedback circuits used with RF amplifiers are analog and of "fixed" capability. The enhanced solution provided by adaptive feedback channel 120 results in a dynamic capability that accommodates changes in the amplifier's performance parameters as its operational environments or requirements change. The feedback control channel implementation can be either analog, digital, or a hybrid, with the digital being the highest performance approach. The enhanced control channel is an expanded application of operational amplifier technology.

The combination of the adaptive feedback channel 120 with the high gain RF amplifier circuit 110 provides numerous benefits, though all of the following benefits do not need to be realized in every embodiment of the invention. For example, amplifier 100 can utilize adaptive feedback channel 120 to improve power output level control over service conditions across a wide frequency range. In addition to wider dynamic range of power output settings, the amplifier can provide high efficiency operation at all power levels. Other benefits of RF amplifier 100 having adaptive feedback channel 120 include improved linearity for wideband and complex waveforms, amplitude modulation within the power amplifier and dynamic linearization, improved thermal characteristics, an improved amplifier noise figure from the high gain low noise first amplifier stage, decreased harmonic and noise output, digital implementation of all control functions, and compatability with new power amplifier designs such as feed forward and quadrature coupled amplifiers. These and other benefits are described below in greater detail with reference to FIGS. 1 and 2.

Referring more specifically to the components illustrated in FIG. 2, it should be noted that FIG. 2 illustrates a typical RF amplifier circuit 110 and does not limit the application of the adaptive feedback technology to this specific circuit configuration. The adaptive feedback technology, for example provided by feedback control channel 120, has application to all types of RF amplifiers including feed forward amplifiers, quadrature coupled amplifiers, single stage amplifiers, and other unique technology systems.

In one example embodiment, RF amplifier circuit 110 includes coupler 120, high gain amplifier stages 132, 135 and 140, coupler 145, high power amplifier stage 150, coupler 155, tap 165 and directional coupler 185. Coupler 120 combines the degenerative feedback 125 from adaptive feedback control channel 120 with RF input signal $RF_{INPUT}$ to provide a modulated RF input signal at coupler output 130. The modulated RF input signal is amplified by single ended amplifier stages 132, 135 and 140, which collectively serve to provide high amplifier gain. As noted above, the amplifier gain provided collectively by stages 132, 135 and 140 has a typical gain of 1000 or more.

The RF input signal provided as an output by amplifier 140 is provided via coupler 145 to a quadrature coupled final high power stage 150 (for example, having a power of 100 to 200 watts). Final stage 150 is driven by amplifier 140 which is a lower power single ended driver stage (for example, 10 to 20 wafts). The driver stage embodied by amplifier 140 is driven by a pre-driver amplifier stage 135 also having low power (for example, 100 to 200 Milliwatts). The pre-driver stage embodied within amplifier 135 is driven by a high gain, low noise amplifier 132 which establishes the noise figure for the power amplifier. The phase angles shown in each of stages 132, 135, 140 and 150 (i.e., 180° and 0°) are shown only for discussion purposes, and can have any combination of phase angles which will allow the phase and amplitude control within adaptive feedback control channel 120 to provide a negative or degenerative signal 125 to the input coupler 120 to reduce channel gain, thus reducing RF output power.

The output 180 of final stage 150 (via coupler 155) is provided to directional coupler 185 which provides the output signal $RF_{OUTPUT}$. Using tap 165, an RF power sample from the output stage 150 is taken to drive the phase and amplitude controller 220. The tap should provide at least a 3 dB signal margin over that which is required to control the feedback loop. This RF energy is provided to the phase and amplitude controller 220, which is a passive (non amplified) device that will shift signal phase or attenuate/adjust the feedback signal's amplitude. The energy supplied for feedback is the energy developed by the RF power amplifier.

The output port of the amplifier has a standard directional coupler 185 to provide forward (transmitted) and reverse (reflected) power measurements 191 and 192 for use by the control and reference module 230. This information is developed in the same manner as current ALC technology. The forward and reflected power information is compared in the control and reference module 230 to the operator or system programmed power output requirement (as defined by Mode/Level/Control input 245). If differences are present, a signal is sent in output 231 to the phase and amplitude controller 230 to adjust the output $RF_{OUTPUT}$ to the desired value via degenerative feedback signal 125.

Control and reference module 230 can be a microprocessor, a digital signal processor (DSP), or other type of programmable controller. Control and reference module 230 receives as inputs information from a number of sources, and provides as outputs information which is provided to a number of other components. For example, control and reference module 230 receives as inputs information from the following sources:

1) Forward and reflected power levels 190 and 192 provided from directional coupler 185 at the output of amplifier circuit 110.
2) Mode/Level/Control commands 245 from the operator or platform system. This input is typically in the form of a digital data word which can be used to control the mode of operation of adaptive feedback channel 120 (and thus of amplifier circuit 110). For example, input 245 can be used to change the operational mode of amplifier 100 such that the RF input 115 is modulated by analog (for example, audio) signals 235. Other example modes of operation include FM modulation, Spread Spectrum and special waveform operation. An example of a special waveform is a spread spectrum signal that frequency hops. For the example we will assume that the equipment operates over the typical military RF spectrum of 225 MHz to 400 MHz and that we are operating from a fighter aircraft and a ground vehicle. The path loss between platforms will vary by frequency, antenna performance, the terrain, and the aircraft attitude. Many of the newer waveforms adjust power levels to just that required to maintain a good Bit Error Rate (BER) over the channel. This may require changing the power output level after each frequency hop. This dynamic power control is required for Low Probability Of Intercept (LPI) or Low Probability of Detection (LPD). Current RF power amplifier technology can not operate in this high dynamic waveform mode. In this mode digital feedback from the receiver is sent via 245 to the control & reference module to change the RF power output in real time. Input 245 is also used to control the desired gain and/or power levels provided by RF amplifier 100. As discussed previously, these power levels can be compared to power levels 190 and 192 from output directional coupler 185, and based on differences, appropriate correction can be effected by providing output 231 (typically in the form of a data word) to phase and amplitude controller 220.

3) Frequency command word input 240 for controlling the operational frequency.
4) Analog or I/Q audio signals from the exciter subsystem (for example used for AM modulation of the RF input signal).
5) Status information such as PTT Key, Blank, Tune, etc.
6) Push To Talk (PTT): is the signal from the operator or the radio transmitter for the power amplifier to began transmission.
7) Key: has the same or similar meaning as PTT.
8) Blank: is a signal generally used to stop transmission for a short time period. An example is when a frequency hopping AM modulated waveform moves from one frequency to another. If the RF power amplifier remains transmitting a very noise RF signal will be transmitted while the synthesizer transitions between frequencies. This type of transmission is prohibited by the FCC.
9) Tune: is the command for an RF system to change frequency. RF power amplifier may select different circuits if the frequency change is very large. Many typical RF amplifier have banded power amplifier sections that must be selected or tuned by the frequency control word.

Control and reference module 230 receives inputs 191, 192, 235, 240 and 245 and uses some or all of this information to generate outputs which are provided, for example to phase and amplitude controller 220 and high dynamic range receiver 215, to control the operational mode and parameters of RF power amplifier system 100. These outputs can include:

1) Frequency command word 232 which is provided to high dynamic range receiver 215 so that receiver 215 can verify that the system is operating at the desired frequency and detect RF levels within that spectrum of interest. Since the amplifiers are typical wide spectrum devices, measures for control must be limited to the spectrum of operation, not the full band.
2) Control information data words 231 provided to phase and amplitude controller 220 in order to dictate information such as the mode of operation and the desired output power levels of amplifier 110. Using control data words 231, phase and amplitude controller 220 can also provide modulation in degenerative feedback 125 in order to modulate the RF input signal 115.
3) Initial set up parameters for the power amplifier. Next generation RF system are computer/processor controlled with input from an operator. System operation parameter are supplied by the computer during start up. The start up parameters are general the last operational setting used by the equipment. If the mission has changed since the last operation or a new mission or operational plan is required the operator inputs that information via his system interface. That control information is then used to configure the RF power amplifier for operation. This is accomplished by input the parameter data to the control & reference module. All amplifier operation is measured to the input parameter and data and adjusted accordingly for operation.
4) The Built In Test (BIT) status for the power amplifier measures the health of the equipment. Current RF power amplifiers have very limited BIT functions because they are just simple RF amplifier. However, when adaptive feedback capability is present in the amplifier BIT is greatly enhanced. BIT measures signals to measure health. The adaptive feedback hardware operates the amplifier by measurement of real time hardware performance and adjusts level to meet a system defined operating envelop. Using this very dynamic control and measurement capability BIT is enhance to many time that of current art technology.

Other components of adaptive feedback control channel 120 are discussed in greater detail in the following description of its general operation. Control and reference module 230 compares operator or system commanded power levels (i.e., from input data word 245) with measured outputs from amplifier circuit 110. For example, using forward and reflected power inputs 190 and 192, and comparing these to a desired power level dictated by input 245, the control and reference module can determine differences between the desired power levels and the actual power levels (this analysis is done in real time). After the analysis, the control and reference module outputs control information data word 231 to control the phase and amplitude controller 220 in order to maintain, increase or decrease the power level of output $RF_{OUTPUT}$ (Changes are intrinsic and variation in output are transparent to waveform operation). A specific subset of this function includes adding AM modulation (specifically modulation using inputs signals 235) to the RF output signals via degenerative feedback 125 and coupler 120. In other words, if input data word 245 contains instructions to AM modulate the $RF_{INPUT}$ signal, then the $RF_{INPUT}$ signal is modulated with signals 235 by controller 220 (via feedback 125).

Using tap 165, a sample 170 of $RF_{OUTPUT}$ 190 is obtained. Using tap 200, this sample is used to provide a forward power reference 205 to phase and amplitude controller 220, and an error reference 210 to high dynamic range receiver 215. High dynamic range receiver 215 receives a tune command in data word 232 which represents the desired frequency of the amplifier. Using output signal 225, the high dynamic range receiver forms a closed loop adaptive control system with the phase and amplitude controller 220 to adjust feedback phase and amplitude to accomplish the desired output level of the amplifier.

High dynamic range receiver 215 converts the error reference 210 (corresponding to a sample of the RF output signal) into a format which can be compared to the information in the control words 232 provided to receiver 215. Typically, high dynamic range receiver 215 will digitize the error reference 210 for comparison to the desired power levels dictated by Mode/Level/Control word 245 and supply to high dynamic range receiver via data word 232. The receiver measures the "error" signals that correspond to changing amplifier parameters and reflects adjustment made by the phase and amplitude controller via the power amplifier. This adjustment is made using an output signal 225 provide to phase and amplitude controller 220. This active modification of the power amplifier feedback loop provides for real time changes due to operational changes or environmental changes to the amplifier unit. The closed loop adaptive function is a significant improvement over traditional RF amplifiers with ALC.

The phase and amplitude controller uses information from several above-described sources to generate a degenerative feedback signal 125 for controlling amplifier circuit 110. The information and sources are as follows:

1) Output 225 from high dynamic range receiver 215 indicative of phase and amplitude errors in the output signal $RF_{OUTPUT}$.

2) Control and reference module commands (via data words 231) to change amplifier operational parameters such as commanded gain, mode of operation instructions, modulation signals, etc.
3) RF reference signal 205 sampled from the power amplifier output.
4) Directional coupler information via the control and reference module (i.e., via data words 231).

The phase and amplitude controller is a passive device that shifts phase and attenuates/adjusts amplitude of the RF sample or reference signal 205 to generate feedback signal 125. The output 125 of the phase and amplitude controller is provided as degenerative feedback to the input (via coupler 120) of the power amplifier circuit 110. This degenerative signal modifies the output of the RF amplifier. The absolute level of the RF signal is a function of total amplifier gain, thus a good high gain design needs only low level feedback signals. An outstanding side effect of degenerative feedback is the reduction of unwanted noise and harmonics products from the amplifier. This effect will be at a maximum at the lowest power output levels (i.e., the highest level of degenerative feedback).

The phase and amplitude controller 220 and the high dynamic range receiver 215 form a closely coupled adaptive control system. The RF signal 170 sampled from the RF power amplifier is a composite signal that powers the phase and amplitude controller 220 and contains power amplifier change information that is directly related to the degenerative feedback loop performance. The high dynamic range receiver is tuned to the desired spectrum to monitor RF amplifier changes. The output 225 of the receiver 215 is fed to the phase and amplitude controller 220 to dynamically "adjust" the output of the RF amplifier to meet desired performance. The primary adjustment is maintaining phase relationships at 180°.

The RF output level in most cases is independent of the RF input signal because of the intrinsic high gain of the full amplifier. The phase and amplitude controller 220 and the high dynamic range receiver 215 form a feedback loop. The control and reference module 230 is similar to placing a variable impedance in a classic feedback loop of an operational amplifier. Thus system 100 implements a dynamic processor controlled operational amplifier equivalent in an RF power amplifier.

In summary, operational or system commands are input to the control and reference module via input data words 240 and/or 245. The control and reference module provides change command words 231 to the phase and amplitude controller 220 and frequency control commands 232 to the receiver 215. The directional coupler 185 provides control information on forward and reverse power levels to the control and reference module 230 for a parallel but unique control path. The receiver 215 provides an active feedback loop with the phase and amplitude controller 220. It receives frequency commands 232 from the control and reference module 230. Feedback 225 from the high dynamic range receiver 215 to the phase and amplitude controller 220 facilitates adaptive correction of any deviations between the desired RF output level and the actual RF level. Audio information 235 is applied to the control and reference module 230 for amplifier modulation of AM signals or linearization of the amplifier if an AM modulated signal is input to the amplifier. BIT capability is provided by the control and reference module.

Although the present invention has been described with reference to illustrative embodiments, workers skilled in the art will recognize that changes may be made in form and detail without departing from the spirit and scope of the invention.

What is claimed is:

1. A radio frequency (RF) amplifier system comprising:
an RF power amplifier having an input and an output;
an adaptive feedback channel coupled between the input and the output of the RF power amplifier, the adaptive feedback channel receiving as inputs audio signals for modulation of the input of the RF power amplifier, a frequency command word indicative of a desired frequency and phase of the RF amplifier system, and a control word indicative of a desired power level of the output of the RF power amplifier and of a mode of operation of the RF amplifier system, wherein in response to the inputs the adaptive feedback channel provides as an output a degenerative feedback signal to the input of the RF power amplifier.

2. The RF amplifier system of claim 1, wherein the adaptive feedback channel comprises:
control and reference module circuitry which receives as inputs the audio signals for modulation of the input of the RF power amplifier, the frequency command word Indicative of a desired frequency and phase of the RF amplifier system, and the control word Indicative of a desired power level of the output of the RF power amplifier and of the mode of operation of the RF amplifier system, the control and reference module circuitry providing as outputs a control information data word to control the desired output power level of the RF power amplifier, and a frequency command word indicative of the desired frequency and phase of the RF power amplifier output;
a high dynamic range receiver coupled to the output of the RF power amplifier and receiving a sample of the output as an input, the high dynamic range receiver also receiving as an input the frequency command word from the control and reference module circuitry, the high dynamic range receiver comparing the sample of the output to phase and frequency information contained in the frequency command word and determining any phase error, the high dynamic range receiver providing as an output a phase adjustment signal as a function of the phase error;
a phase and amplitude controller coupled to the control and reference module, to the high dynamic range receiver and to the output of the RF power amplifier, the phase and amplitude controller receiving as inputs the control information data word from the control and reference module, the phase adjustment signal from the high dynamic range receiver, and the sample of the output of the RF power amplifier, the phase and amplitude controller generating in response the degenerative feedback signal to control the phase and amplitude of the output of the RF power amplifier.

3. The RF amplifier system of claim 2, wherein the control and reference module circuitry also receives as an input forward and reflected power signals which are respectively indicative of power of signals transmitted by the output of the RF power amplifier and power of signals reflected back to the output of the RE power amplifier, the control and reference module circuitry generating the a control information data word to control the desired output power level of the RF power amplifier also as a function of the forward and reflected power signals.

4. The RF amplifier system of claim 3, wherein the control and reference module circuitry generates the control information data word also as a function of a desired mode of operation of the RF amplifier system, and wherein the phase and amplitude controller generates the degenerative feedback signal as a function of the desired mode of operation.

5. The RF amplifier system of claim 4, wherein the control and reference module circuitry generates the control information data word as a function of audio signals when the desired mode of operation of the RF amplifier system is an amplitude modulation mode of operation, and wherein the phase and amplitude controller generates the degenerative feedback signal such that the input to the RF power amplifier is amplitude modulated by the audio signals.

6. The RF amplifier system of claim 5, wherein the RF power amplifier input includes a first coupler which receives an RF input signal and the degenerative feedback signal as inputs, and provides as a coupler output a modulated RF input signal.

7. The RF amplifier system of claim 3, wherein the high dynamic range receiver generates the phase adjustment signal to maintain a phase change between the input and output of the RF power amplifier of 180 degrees.

8. The RF amplifier system of claim 7, wherein the RF power amplifier includes at least one high gain amplification stage coupled to the input and at least one high power driver stage coupled to the output.

9. The RF amplifier system of claim 8, wherein the output of the RF power amplifier includes a directional coupler coupled to the high power driver stage, and wherein the directional coupler provides as outputs an RF output signal and the input forward and reflected power signals.

10. The RF amplifier system of claim 9, wherein the RF power amplifier further includes;
a second coupler coupling the high power driver stage to the directional coupler; and
a tap coupled between the second coupler and the directional coupler, the tap providing the sample of the output to the high dynamic range receiver and the phase and amplitude controller.

11. The RF amplifier system of claim 1, wherein the RF power amplifier provides a gain of at least 30 between the input and the output.

12. The RF amplifier system of claim 1, wherein the RF power amplifier provides a gain of at least 100 between the input and the output.

13. The RF power amplifier system of claim 1, wherein the RF power amplifier provides a gain of at least 1000 between the input and the output.

* * * * *